United States Patent
San et al.

(10) Patent No.: US 6,815,332 B2
(45) Date of Patent: Nov. 9, 2004

(54) METHOD FOR FORMING INTEGRATED DIELECTRIC LAYERS

(75) Inventors: Nelson Loke Chou San, Tama (JP); Kiyoshi Satoh, Tama (JP)

(73) Assignee: ASM Japan K.K., Tokyo (JP)

( * ) Notice: Subject to any disclaimer, the term of this patent is extended or adjusted under 35 U.S.C. 154(b) by 10 days.

(21) Appl. No.: 10/284,517

(22) Filed: Oct. 30, 2002

(65) Prior Publication Data

US 2004/0087179 A1 May 6, 2004

(51) Int. Cl.⁷ ............................................. H01L 21/4763
(52) U.S. Cl. ....................... 438/623; 438/970; 438/624; 438/780
(58) Field of Search ............................ 438/970, 623, 438/624, 780, 786, 789

(56) References Cited

U.S. PATENT DOCUMENTS

| | | |
|---|---|---|
| 6,100,184 A | 8/2000 | Zhao et al. |
| 6,140,226 A | 10/2000 | Grill et al. |
| 6,177,364 B1 | 1/2001 | Huang |
| 6,211,092 B1 | 4/2001 | Tang et al. |
| 6,287,990 B1 * | 9/2001 | Cheung et al. ............. 438/780 |
| 6,340,435 B1 | 1/2002 | Bjorkman et al. |
| 6,576,564 B2 * | 6/2003 | Agarwal ..................... 438/758 |
| 6,593,247 B1 * | 7/2003 | Huang et al. ............... 438/758 |
| 6,627,532 B1 * | 9/2003 | Gaillard et al. ............. 438/623 |

* cited by examiner

*Primary Examiner*—Amir Zarabian
*Assistant Examiner*—Christy Novacek
(74) *Attorney, Agent, or Firm*—Knobbe Martens Olson & Bear, LLP (57) ABSTRACT

A method for forming integrated dielectric layers using plasma energy includes (i) depositing a first dielectric layer on a substrate using a first reaction gas comprised of a source gas at a first source gas flow rate and an inert gas at a first inert gas flow rate, wherein the first inert gas flow rate is no more than 40% of the first source gas flow rate, and (ii) continuously depositing a second dielectric layer on top of the first dielectric layer using a second reaction gas comprised of a source gas at a second source gas flow rate and an inert gas at a second inert gas flow rate, wherein the second inert gas flow rate is 40% or higher of the second source gas flow rate.

34 Claims, 4 Drawing Sheets

METHOD FOR FORMING INTEGRATED DIELECTRIC LAYERS

BACKGROUND OF THE INVENTION

1. Field of the Invention

This invention relates to methods of forming integrated dielectric layers which may be used in semiconductor devices, and particularly relates to methods that involve formation of etch-stop layers using a CVD apparatus.

2. Description of the Related Art

Semiconductor devices include metal layers that are insulated from each other by dielectric layers. As device features shrink, a reduction of the distance between the metal layers increases. To achieve this task, a low dielectric film is introduced to replace the conventional silicon dioxide films and other materials having a relatively high dielectric constant to form a dielectric layer that separates the metal lines, i.e., metal layers.

A material that may be considered suitable for such a task includes a carbon-doped silicon dioxide film. Using this material to divide the metal lines may yield a device having a reduced propagation delay, cross-talk noise, and power dissipation. Although this film appears to be perfect for replacing silicon dioxide films, there are other film properties that may not be comparable to silicon dioxide films. That includes, for instance, elastic modulus and hardness. Most carbon-doped films have less than 14% of silicon dioxide elastic modulus and 20% of silicon dioxide hardness. These may lead to a severe problem when the wafer is subjected to subsequent processes such as chemical mechanical polishing (CMP) and packaging involving long-standing integration issues.

Accordingly, there is a need for films having high modulus and hardness to circumvent the long-standing integration issues. The conventional schemes of so called "no etch-stop integration" have not been very successful due to the occurrence of strong attack on the corners of via holes during a subsequent metal trench etch process.

Various damascene methods have been reported in the field of microelectronic fabrication for forming within microelectronic fabrications damascene structures with desirable properties. For example, the damascene methods include, but are not limited to, the damascene methods disclosed in the following, the disclosure of which is incorporated herein by reference in its entirety:

(1) U.S. Pat. No. 6,100,184 to Zhao et al., teaching a dual damascene method for forming a copper-containing contiguous patterned conductor interconnect and a patterned conductor stud layer within a corresponding trench contiguous with a corresponding via formed through a dielectric layer formed with a comparatively low dielectric constant dielectric material, thereby contacting a copper-containing conductor layer formed thereunder, wherein a conductor barrier/etch-stop layer is used to selectively passivate only the top surface of the copper-containing conductor layer formed thereunder;

(2) U.S. Pat. No. 6,140,226 Zhao et al. teaching a dual damascene method for forming a contiguous patterned conductor interconnect and a patterned conductor stud layer within a corresponding trench contiguous with a corresponding via through a dielectric layer formed with a comparatively low dielectric constant dielectric material wherein a sidewall liner layer is used for the purposes of protecting a sidewall of the trench from lateral etching when contiguously forming the via therewith;

(3) U.S. Pat. No. 6,177,364 to Huang teaching a dual damascene method for forming a contiguous patterned conductor interconnect and a patterned conductor stud layer within a corresponding trench contiguous with a corresponding via through a dielectric layer formed with a comparatively low dielectric constant fluorosilicate glass (FSG) dielectric material wherein a hydrogen-nitrogen plasma treatment is employed for the purposes of passivating a sidewall surface of the dielectric layer within the corresponding trench contiguous with the corresponding via prior to forming therein the contiguous patterned conductor interconnect and patterned conductor stud layer; and (4) U.S. Pat. No. 6,211,092 to Tang et al. teaching a counterbore type dielectric etch method which may be employed when forming through a dielectric layer a dual damascene aperture for a dual damascene method, wherein the counterbore type dielectric etch method uses a plurality of etch steps when first forming a via through the dielectric layer.

In the field of microelectronic fabrication, desirable are additional damascene methods and materials which can be employed for providing patterned microelectronic conductor layers each interposed between microelectronic dielectric layers formed with comparatively low dielectric constant dielectric materials, thereby attenuating damage to the microelectronic dielectric layers.

All low-dielectric constant films that are currently available on the market are manufactured accordingly and have an elastic modulus of lower than 10 GPa as measured by Diamond indentation methods (e.g., by a Nano-indenter manufactured by MTS).

An object of the present invention is to provide a method and a film having great advantages over the conventional methods and films with respect to subsequent processes such as CMP and Packaging.

The conventional integration methods are further explained below. In implementing conventional dual damascene techniques wherein a via is formed before a trench, an etch-stop layer is formed on and under a first dielectric layer which overlies a capped metal feature. The etch-stop layer is typically formed with silicon oxide, silicon nitride, silicon oxynitride, or silicon carbide, which is chosen for its high etch selectivity with respect to an overlying second dielectric layer which is then deposited on the etch-stop layer. Thus, the second dielectric layer is deposited on the upper etch-stop layer. A photoresist mask is then formed over the second dielectric layer, and anisotropic etching is conducted to form a via through the first and second dielectric layers and stops on the lower etch-stop layer. Subsequently, a trench pattern is formed on the second dielectric with a barrier anti-reflective coating (BARC) filling the via (Conformal and Planarization). Trench anisotropic etching is conducted to form a trench and stops on the upper etch-stop layer (which is under, the second dielectric layer and thus is referred to as an "intermediate" etch-stop layer). Finally, the photoresist is removed with a conventional ashing process, and then copper metallization is commenced.

As miniaturization proceeds apace with attendant shrinkage in the size of metal lines, e.g., the width of a metal line is about 0.25 micron or lower, or about 0.1 micron or lower, the ILD dielectric constant of the interlining material is very important. This includes the dielectric constant of the etch-stop layer. Accordingly, there is the need for an interconnection methodology enabling the formation of metal features, such as metal lines, with high dimensional accuracy and low effective k-value.

The present invention provides solutions to these complicated integration problems.

SUMMARY OF THE INVENTION

In an aspect of the present invention, a method is provided to form on a substrate a laminated structure including a layer-to-be-etched and an etch-stop layer. In an embodiment, the method comprises the steps of: (i) introducing into a reactor a reaction gas comprised of a source gas containing silicon and carbon at a source gas flow rate and an inert gas at an inert gas flow rate which is 40% or higher of the source gas flow rate; (ii) applying plasma energy to a space where the reaction gas is present upstream of a substrate mounted on a heated substrate-supporting member; (iii) forming an etch-stop layer on the substrate from the reaction gas with plasma energy; and (iv) forming a laminated structure by forming at least one layer-to-be-etched on the substrate. In the above, the laminated structure may be a dual damascene structure.

The source gas may be $Si_\alpha O_{\alpha-1} R_{2\alpha-\beta+2}(OC_n H_{2n+1})$ wherein $\alpha$ is an integer of 1–3, $\beta$ is an integer of 1–3, n is an integer of 1–3, and R is $C_{1-6}$ hydrocarbon attached to Si. In a preferred embodiment, the source gas is dimethyldimethoxy silane.

According to the above embodiment of the prevent invention, the etch-stop layer can be formed by changing the inert gas flow rate, the step of forming the etch-stop layer and the step of forming the layer-to-be-etched can continuously be conducted in the same chamber without breaking a vacuum. This may be a great advantage to semiconductor device manufacturing. Further, the step of forming the etch-stop layer and the step of forming the layer-to-be-etched can use the same source gas and inert gas.

When the inert gas flow rate is high, the density of the resulting film becomes high, i.e., exhibiting excellent hardness and resistance to etching treatment. Thus, the inert gas flow rate in the step of forming the etch-stop layer may be higher than in the step of forming the layer-to-be-etched. Further, in the step of forming the layer-to-be-etched, the inert gas flow rate may be no more than 40% of the source gas flow rate, so that two films having different characteristics can easily be produced. The layer-to-be-etched may serve as an insulator and the etch-stop layer may serve as a mask, and thus, the step of forming the etch-stop layer may be conducted under conditions to adjust a dielectric constant of the etch-stop layer to 3.0 or lower.

In an embodiment, the plasma energy may be applied between a showerhead and a susceptor, which serve as upper and lower electrodes, respectively, wherein the substrate is mounted on the susceptor. Further, the reaction gas may be excited with plasma energy in a remote plasma chamber prior to the step of introducing the reaction gas into the reactor.

The source gas flow rate may be in the range of 50 sccm to 200 sccm in an embodiment.

The method may further comprise etching the layer-to-be-etched except for the etch-stop layer to form a hole, and filling the hole with copper.

In another aspect of the present invention, a method of dielectric film integration is provided. In an embodiment, the method comprises the steps of: (i) depositing a first dielectric layer on a substrate using a first reaction gas comprised of a source gas containing Si, C, O, and H at a first source gas flow rate and an inert gas at a first inert gas flow rate, wherein the first inert gas flow rate is no more than 40% of the first source gas flow rate, said first reaction gas being excited with plasma energy; and (ii) continuously depositing a second dielectric layer on top of the first dielectric layer using a second reaction gas comprised of a source gas containing Si, C, O, and H at a second source gas flow rate and a second inert gas at a second inert gas flow rate, wherein the second inert gas flow rate is 40% or higher of the second source gas flow rate, said second reaction gas being excited with plasma energy. In the above, the source gas may be an alkyl organic silicate. Further, the first and second dielectric layers may be made of carbon-doped silicon oxide in an embodiment.

The first dielectric layer can serve as an inter metal dielectric (IMD) layer. The second dielectric layer can serve as an IMD etch stop layer or a chemical mechanical polishing (CMP) cap layer.

According to the above embodiments, the first and second dielectric layers can have a modulus of 12 GPa or lower and 13 GPa or higher, respectively. Further, the first and second dielectric layers can have a hardness of 2.0 GPa or lower and 2.0 GPa or higher. Thus, the first and second dielectric layers may effectively serve as an insulator and an etch stopper, respectively.

The dielectric layers may have an amorphous structure wherein the Si of Si—O as C bonded thereto, which C has H bonded thereto.

As with the first aspect of the present invention, the step of forming the first dielectric layer and the step of forming the second dielectric layer may continuously be conducted in the same chamber without breaking a vacuum or at least without unloading the substrate from a reactor. In an embodiment, the method may be conducted in a CVD chamber. Further, the step of forming the first dielectric layer and the step of forming the second dielectric layer may use the same source gas and inert gas. The first and second source gas flow rates may also be independently in the range of 50 sccm to 200 sccm. The step of forming the second dielectric layer may be conducted under conditions to adjust a dielectric constant of said layer to 3.0 or lower.

In another embodiment, the first and second reaction gases may be first excited with plasma energy in a remote plasma chamber disposed upstream of a reactor where the substrate is processed.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

DETAILED DESCRIPTION OF THE PREFERRED EMBODIMENT

As described above, the present invention can be adapted to various applications.

In an embodiment, the present invention provides a method of depositing a dielectric film which may have a low dielectric constant of less than 3.0 with an elastic modulus and hardness of more than 12 GPa and 2.1 GPa, respectively. The film is particularly useful as an etch stop film in dual damascene structure formation. The low dielectric constant film of less than 3.5 has greater advantage over the conventional etch stop of 4.9 in k value such as silicon carbide films.

In an embodiment, when a SiCO film is formed on a silicon substrate, a mixed gas of $Si(OCH_3)_2(CH_3)_2$ and helium is supplied. The $Si(OCH_3)_2(CH_3)_2$ and He gas ratio is adjusted by using a setpoint of above 40% of $Si(OCH_3)_2(CH_3)_2$ in the mixed gas, for example. By means of plasma energy, a thin film is formed on the substrate. In another embodiment, tetramethylsilane ($Si(CH_3)_4$) or trimethylsilane ($SiH(CH_3)_3$) can be adopted for SiCO film formation.

For example, in an embodiment, film formation can be conducted under the following conditions:

Helium: $Si(OCH_3)_2(CH_3)_2$ ratio of above 40%

27.12 MHz=1400–1800 W or with combination of 400 KHz RF-power

Pressure=560 Pa

Electrode gap=24 mm

Substrate temperature=370–380° C.

The CVD device of the preferred embodiments chamber that is provided remotely from the reaction chamber, and piping that links the reaction chamber with the remote plasma discharge energy. This will be explained with reference to FIG. 6.

Figure 6:
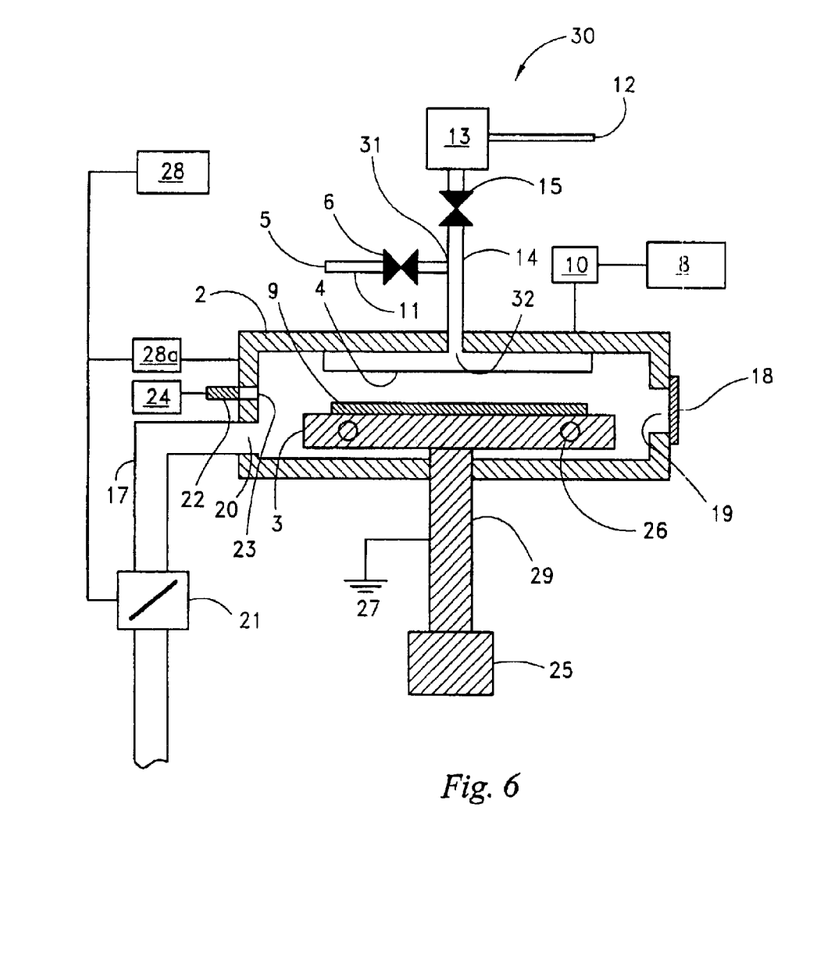
FIG. 6 is a schematic view of another embodiment showing a CVD apparatus usable for the present invention.

FIG. 6 is a schematic cross section of exemplary plasma CVD device according to a first embodiment of the present invention. A plasma CVD device 30, which is used to form a thin film on a substrate 9 such as a semiconductor wafer, comprises a reaction chamber 2, a support 3 provided within the reaction chamber to support the semiconductor wafer 9, a shower-head 4 that is positioned to face the support 3 and is used to jet out a reaction gas uniformly onto the semiconductor wafer 9, an outlet 20 to exhaust a treated reaction gas and byproducts from the reaction chamber 2, and a remote plasma discharge chamber 13. The remote plasma discharge chamber 13 is positioned remotely from reaction chamber 2 and is linked to the showerhead 4 via piping 14 and valve 15. The remote plasma discharge chamber 13 has characteristics wherein it generates active species using radio-frequency oscillating output energy of a designated frequency, and the piping 14 is made of materials that are not corroded by the active species.

The plasma CVD device 30 of FIG. 6 includes a link between one end of the reaction conduit 11 and piping 14 at a junction 31 positioned between the remote plasma discharge chamber 13 and a gas exit port 32. Reaction gas and cleaning gas are mixed at the junction 31 and are brought into a showerhead 4 from one gas inlet port 32. In the illustrated example, the valve 15 is set up at the plasma discharge chamber side before the junction 31.

The support 3 that is provided within the reaction chamber 2 and is used to place the semiconductor wafer 9 is made of anodized aluminum of aluminum alloy and is grounded 27 to constitute one side of an electrode of plasma discharge. The reaction chamber 2 of the illustrated embodiment is a plasma CVD chamber configured for in situ plasma generation (plasma generation inside the chamber). Within the illustrated support 3, a ring-shape heating element 26 is embedded and the semiconductor wafer's temperature is controlled at a predetermined temperature using a temperature controller (not shown). The support 3 is connected to a driving mechanism 25 that moves the support 3 up and down using a support piston 29.

Within the reaction chamber 2, the showerhead 4 is provided at a position facing the support 3. In the showerhead 4, thousands of fine holes are provided to inject a reaction gas onto the semiconductor wafer 9. The showerhead is electrically connected to a radio-frequency oscillator 8 via a matching circuit 10 and constitutes another electrode for plasma discharge. To bring a reaction gas to be used for film formation from the showerhead 4, a reaction gas conduit 11 is connected to the piping 14. The number of the gas conduit 11 is not limited to one. According to the type of reaction gas, the necessary number of gas conduits can be installed. One end of the gas conduit 11 constitutes a gas inlet port 5 to cause a reaction gas to flow in and the other end constitutes a reaction gas exit port 32 to cause gas to flow out to the showerhead 4. In the middle of the reaction gas conduit 11, a mass flow controller (not shown) and a valve 6 are positioned.

On the side wall of the reaction chamber 2, an outlet 20 is provided. The outlet 20 is connected to a vacuum exhaust pump (not shown) through piping 17. Between the outlet 20 and the vacuum pump, a conductance-controlling valve 21 is provided to regulate pressure within the reaction chamber 2. The conductance-controlling valve 21 is electrically connected to and external regulator.

Additionally, a pressure gauge 28a is preferably provided to measure the pressure within the reaction chamber 2. This pressure gauge is electrically connected to the regulator 28.

An observation window 23 is preferably also provided on the side wall of the reaction furnace 2 and a charged coupled device (CCD) detector 22 is mounted on the observation window. Furthermore, a monitor 24 is installed on the CCD detector 22. The observation window 23 is preferably made of sapphire, but aluminum oxide can also be used. Also, in addition to the CCD detector, a photomultiplier tube or a photoelectric converter can also be used.

The CVD apparatus disclosed in U.S. application Ser. No. 09/764,523, filed Jan. 18, 2001 is usable in the present invention, and the disclosure of the application is herein incorporated by reference in its entirety.

The following will illustrate an embodiment of film formation of the present invention of low-k high-modulus film formed on the wafer 9.

First the inside of the reaction chamber 2 is evacuated and exhausted by an external vacuum pump (not shown) through the outlet 20. Pressure within the reaction chamber can be regulated in a range of from 500 Pa to 700 Pa (including a range of 500 to 600 PA) by the degree of opening of the conductance-controlling valve 21. Next, the support 3 heated by the heating element 26 controls the temperature of the semiconductor wafer 9 at a designated temperature (as measured as the substrate temperature) in the range of 300° C. to 450° C., preferably 325° C. to 375° C. using a temperature controller (not shown).

Subsequently, an inert gas flows into the reaction chamber at a ratio of 40% or higher of liquid source gas such as dimethyl-dimethoxy silane (DMDMOS, $Si(OCH_3)_2(CH_3)_2$). When a flow rate of DMDMOS is 100 sccm, for example, the inert gas flow rate is 40 sccm or higher, preferably 70 sccm or higher (70% or higher of the DMDMOS flow). In the above, in an embodiment, the DMDMOS flow is 50 sccm or higher, preferably 100 sccm or higher (including 300 sccm), more preferably a range of from 100 sccm to 200 sccm, for processing φ200 mm semiconductor substrates. If substrates having a larger diameter such as φ300 mm are treated, the source gas flow increases accordingly (e.g., proportionally to the increase in diameter).

In an embodiment, the inert gas flow for a high modulus layer is 40% or higher of the source gas flow, which inert gas flow includes 45%, 50%, 55%, 60%, 65%, 70%, 75%, 80%, 90%, 100%, 110%, 120%, 150%, 170%, 200%, 250%, 300%, and a range between any of the foregoing, for example.

When combining a high modulus layer with a conventional type dielectric layer, the inert gas flow for a conventional type dielectric layer is no more than 40%, which inert gas flow includes 35%, 30%, 25%, 20%, 15%, 10%, 5%, 0%, and a range between any of the foregoing, for example.

As a source gas, any suitable material for low-k films can be used including a gas comprising Si, C, H, and O in its molecule structure. For example, silicon-containing hydrocarbon having the formula $Si_\alpha O_{\alpha-1} R_{2\alpha-\beta+2}(OC_n H_{2n+1})_\beta$, wherein α is an integer of 1–3, β is an integer of 1–3, n is an integer of 1–3, and R is $C_{1-6}$ hydrocarbon attached to Si, can be used. The low-k films may be made of non-doped silicon glass (NSG), phosphate-doped silicon glass (PSG), boron phosphate-doped silicon glass (BPSG), fluorine-doped silicon glass (FSG), silicon-containing carbon compounds, organo silicon, or siloxan polymer, etc. Siloxan polymers can effectively be used as disclosed in U.S. Pat. No. 6,455,445 issued Sep. 24, 2002, U.S. Pat. No. 6,352,945 issued Mar. 5, 2002, U.S. Pat. No. 6,383,955 issued May 7, 2002, U.S. Pat. No. 6,410,463 issued Jun. 25, 2002, and U.S. Pat. No. 6,432,846 issued Aug. 13, 2002, disclose material gases which are also usable in the present invention. The disclosure of each U.S. patent application is herein incorporated by reference in its entirety.

As an inert gas, He, Ar, Ne, Kr, or a mixture of any two or more of the foregoing can be used. He or Ar is preferred to deposit a high-modulus film. A mixture of He and Ar may be effective in obtaining a low-k film having a higher hardness value. The gases can be pre-mixed prior to or at an inlet port 5 before flowing into the showerhead 4 through the gas exit port 32 after passing the valve 6. Mixing can be accomplished in a liquid state or in gaseous state.

Power having a radio-frequency of 27 MHz or mixed power between 27 MHz and 400 KHz, for example, is applied to the shower head 4 by the radio-frequency source 8. For example, to generate a plasma discharge in the reaction chamber, 27 MHz RF power is applied to the showerhead 4, which power is approximately 1000 W (2.63 $W/cm^2$) to 3000 W (7.90 $W/cm^2$), preferably 1500 w (3.95 $W/cm^2$) to 2000 w (5.26 $W/cm^2$). In another embodiment, 13.56 MHz RF power, mixed RF power of 13.56 MHz and 350 kHz–500 kHz, or mixed RF power of 27.12 MHz and 350 kHz–500 kHz, can be used for plasma generation. In an embodiment, when mixed RF power of 27.12 MHz and 400 KHz is applied to the upper electrode, 27.12 MHz power may be in the range of from 500 w to 3000 w, and 400 kHz power may be in the rage of from 100 W to 1000 W. In another embodiment, 27.12 MHz power may be in the range of from 1000 W to 2000 W, and 400 kHz power may be in the range of from 150 w to 500 w. Further, in an embodiment, when mixed RF power of 13.56 MHz and 400 kHz is applied to upper electrode, 13.56 MHz power may be in the range of from 500 W to 2000 W, and 400 KHz power may be in the range of from 100 W to 1000 W. In another embodiment, 13.56 MHz power may be in the range from 750 W to 1500 W, and 400 kHz may be in the range of from 200 W to 500 W. Additionally, when 13.56 MHz is used alone for plasma generation, its RF power may be set in the range of from 500 W to 3000 W, preferably from 750 W to 1500 W. The power can vary and should not be limited to the above, and it depends on the type of reaction gas, the size of substrate, the type of CVD apparatus, and conditions for plasma treatment.

The low-k layers can be deposited by any suitable methods including plasma CVD (including RP-CVD and PECVD) and thermal CVD, etc. The methods disclosed in the aforesaid U.S. patents, the disclosure of which are incorporated herein by reference, can be used for this purpose.

Each parameter can be optimized to deposit on various size substrates or reaction chambers.

As a result, a plasma reaction domain is formed in a space between the showerhead 4, which serves as one electrode for in situ plasma generation within the reaction chamber 2, and the support 3 which serves as the other electrode. Molecules of reaction gas within that domain are activated and ionized by plasma energy. Ionized molecules cause chemical reaction on the semiconductor substrate 9 and a low-k film having high hardness is formed.

An embodiment of a CDO (carbon-doped oxide) low-k film (conventional type film, i.e., having insufficient hardness) has the following characteristics:

Hardness <2.0 GPa (including a range of 1.7 to 2.0 GPa)

Elastic Modulus <11 GPa (including a range of 9 to 11 GPa)

K-value <2.9 (including a range of 2.7 to 2.9)

An embodiment of a low-k hard film has the following characteristics:

Hardness >2.0 GPa (including a range of 2.0 to 2.5 GPa)

Elastic Modulus >12 GPa (including a range of 11 to 15 GPa)

K-Value <3.0 (including a range of 2.8 to 3.0)

In the above, hardness can be measured according to Diamond indentation methods. Elastic modulus can be measured according to Diamond indentation methods.

In the present invention, thickness uniformity of both the CDO low-k film and the low-k hard film is less than 3% at 1 σ, which satisfies requirements for LSI devices.

In an embodiment, in the above, the CDO low-k film can be formed first by flowing He to a liquid source gas at a rate of lower than 40% of the source gas. When the film reaches a desired thickness based on the processing time, the helium flow further can increase to a rate of 40% or higher, thereby forming the high modulus film on top of the conventional type low-k film. Hence, a hard mask is formed in-situ without breaking a vacuum. When the flow rate of inert gas is 40% or higher of the flow rate of source gas, the density of the film increases, resulting in an increase in hardness. The laminated structure can vary depending on the integration scheme, and any suitable structure for the intended use can be formed. The CDO low-k film can be used as an insulator which may be formed between metal lines, and the high modulus film can be used as an etch stopper which may be used when forming a hole such as a via hole in the laminated structure. However, the intended use for each film is not limited to the above, and the CDO low-k film can be used for multi-level IMD (Inter Metal Dielectric), whereas the high modulus film can be used for CMP cap and intermediate etch stop, for example.

Upon termination of thin film formation processing, the valve 6 is closed and at the same time the gate valve 18 is opened. An automatic transfer robot (not shown) carries out the processed semiconductor wafer 9 to an adjoining transfer chamber (not shown) through the opening 19. After the reaction chamber 2 is evacuated and exhausted, an unprocessed semiconductor wafer is carried in from the transfer chamber, the gate valve 18 is closed, and the above sequence is repeated.

Figure 1:
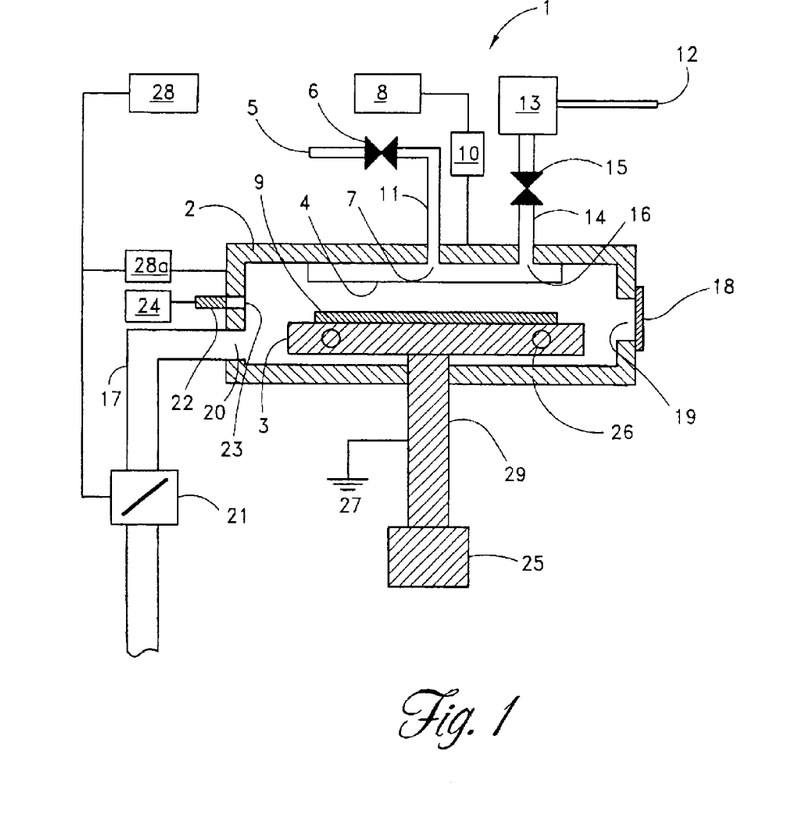
FIG. 1 is a schematic view of a CVD apparatus usable for the present invention.

FIG. 1 is a schematic cross section of exemplary plasma CVD device according to a second embodiment of the present invention. A plasma CVD device 1 of FIG. 1 does not include a junction 31 connecting one end of the reaction conduit 11 and piping 14 as illustrated in FIG. 6. A remote plasma discharge chamber 13 according to this embodiment is remotely provided from the reaction chamber 2. The remote plasma discharge chamber 13 is made of anodized aluminum alloy. The remote plasma discharge chamber 13 is linked to the showerhead 4 within the reaction chamber through piping 14. In the middle of the piping 14, a valve 15 is provided. The internal surface of this piping 14 preferably made of fluoride-passivated stainless steel, but aluminum or fluoride-passivated aluminum alloy can be also used. Also similarly, the internal surface of the valve 15 is made of fluoride-passivated aluminum alloy. One end of the piping 14 constitutes a cleaning gas inlet port 12 to cause cleaning gas to flow in and the other end constitutes a cleaning gas exit port 16 to bring cleaning gas into the showerhead 4. The device 1 can be otherwise similar to the device 30 of FIG. 6.

In additional to the above, the present invention can be applied to form various film formation processes.

Figure 2:
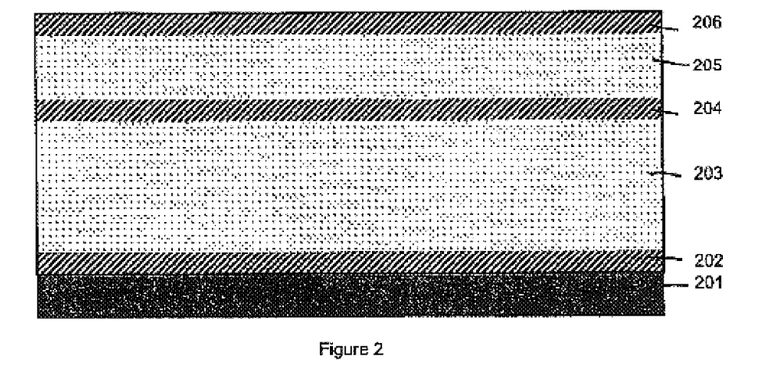
FIG. 2 is a cross section of an embodiment illustrating a laminated structure formed on a substrate according to the present invention.

In FIG. 2, a layer 201 is an underlying layer. The layer 201 may be a Si-substrate or FEOL (Front End Of Line) device which is composed of a tungsten plug and dielectric oxide. On top of the layer 201, a hard film layer 202 can be deposited at a thickness of 0.02 to 0.09 µm (including a range of 0.05 to 0.07 µm). Subsequently, a conventional type low-k film, e.g., a CDO film depicted by a layer 203, is deposited at a thickness of 0.3 to 0.8 µm (including a range of 0.4 to 0.6 µm). A second hard film layer 204 is formed on the layer 203 at a thickness of 0.02 to 0.10 µm (including a range of 0.04 to 0.05 µm) as an etch-stop layer. Finally, a conventional type low-k film 205 is deposited at a thickness of 0.3 to 0.5 µm (including 0.4 µm), followed by formation of a third hard film layer 206 at a thickness of 0.02 to 0.1 µm (including a range of 0.05 to 0.07 µm). These complete the deposition steps. The formula of the first hard film layer 202, the second hard film layer 204, and the third hard film layer 206 can be the same or different. For example, the hardness of the respective hard film layers can be changed simply by reducing the flow rate of inert gas as deposition progresses, wherein the first hard film layer is harder than the last hard film layer. The number of hard film layers is not limited to one, two or three but includes more than three, depending on the intended use of the semiconductor device. Further, the laminated structure is not limited to this embodiment but includes multi-level DD (dual damascene) structures such as those in the above embodiment where layers are stacked on top of each other.

All of the films can be deposited in a single CVD chamber by changing process gas flows or RF powers, and can also be deposited continuously without unloading from the CVD chamber. Further, if the conventional type low-k films are formed from the same source gas as that for the hard film layers, a dual damascene structure can easily be formed by changing the inert gas flow.

For instance, layers 201, 202, 203, 204, 205 and 206 can be formed sequentially within a single loading without unloading the wafer. This can be achieved by utilizing multiple-step deposition recipes.

This increases machine throughputs and reduces gas consumption.

The function of the hard film will further be explained with reference to FIG. 3. In the course of forming a dual damascene structure, if one uses a via first etch scheme, a via 207 can be formed by RIE (Reactive Ion Etching), for example. Hence, the hard film 202 serves as an etch-stop layer during the etch process. The formation of a via can also be achieved by trench first scheme. The width of the via may be in the range of 0.09 to 0.25 µm (including a range of 0.13 to 0.18 µm).

Figure 3:
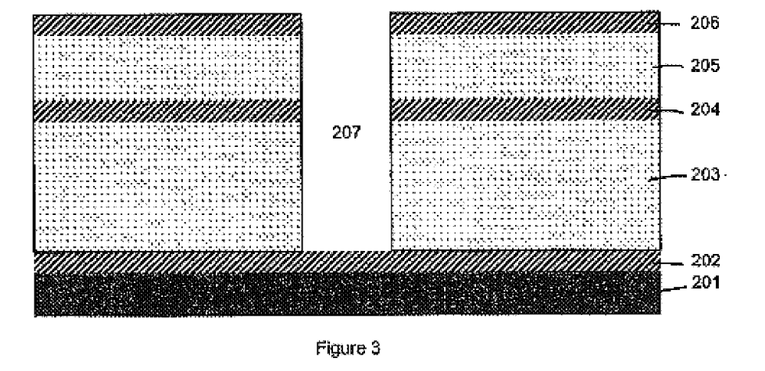
FIG. 3 is a cross section of an embodiment illustrating formation of a via hole in the laminated structure according to the present invention.
Figure 4:
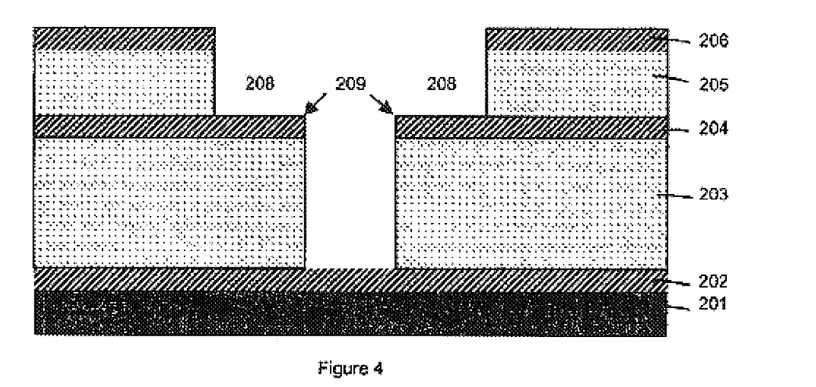
FIG. 4 is a cross section of an embodiment illustrating formation of a trench in the laminated structure according to the present invention.

The step indicated in FIG. 3 is followed by formation of a trench 208 as shown in FIG. 4. The width of the trench may be in the range of 0.10 to 0.28 µm (including a range of 0.01 to 0.18 µm). In this process, the layer 204 serves partially as an etch-stop layer for trench RIE (Reactive Ion Etching). On top of this, the hard film 204 also prevent the occurrence of severe sloping of the corner 209, thus giving rise to a good dual damascene structure. In FIG. 4, the purpose of the hard film 206 is as follows: After the formation of the dual damascene structure, a copper process commences as a final step at CMP. The layer 206 serves as a sacrificial layer to prevent an excessive loss of the dielectric film which may occur during over-polishing of the copper in the CMP process. The above described etching processes can be achieved by any suitable methods.

Figure 5:
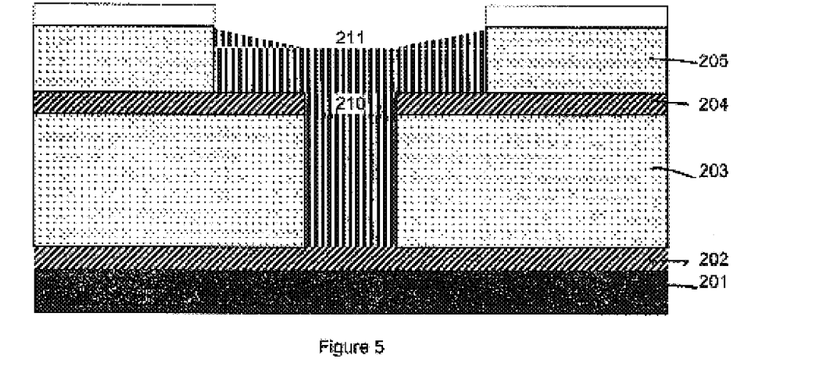
FIG. 5 is a cross section of an embodiment illustrating the trench filled with copper.

In FIG. 5, the final structure of a copper 210 laid in the dual damascene structure from which the layer 206 is removed. As described above, by utilizing the layer 206 as a sacrificial layer, a copper dishing 211 can be minimized. This give rises to a better CMP process control during over-polishing. Furthermore, the sacrificial layer 206 will protect the device from CMP defects such as scratches, delaminations, and particles, etc According to the present invention, in an embodiment, only a series of lower k films are used in a dual damascene structure, wherein k values of the layers is very low as compared with etch stoppers in conventional structures. Furthermore, the insulation film and etch stopper film can be formed in a single CVD chamber and in continuous sequence. In an embodiment, the etch rate of an etch stopper is 1/10 or less of the etch rate of an insulation film.

The following references disclose related technology and are incorporated herein by reference. US 2002/0011210A1, "Semiconductor-Processing Device Provided With A Remote Plasma Source For Self-Cleaning"; U.S. Pat. No. 6,350,670B1, "Method For Making A semiconductor Device Having A Carbon Doped Oxide Insulating Layer"; U.S. Pat. No. 6,316,063B1, "A Method For Preparing carbon Doped Oxide Insulating Layers"; U.S. Pat. No. 6,348,725B2, "Plasma Processes For Depositing Low Dielectric Constant Films"; U.S. Pat. No. 6,440,838, "Dual damascene structure employing laminated intermediate etch-stop layer"; and U.S. Pat. No. 6,440,861, "Method of forming dual damascene structure".

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming on a substrate a laminated structure including a layer-to-be-etched and an etch-stop layer, comprising the steps of:
   introducing into a reactor a reaction gas comprised of a source gas containing silicon and carbon at a source gas flow rate and an inert gas at an inert gas flow rate which is 40% or higher of the source gas flow rate, said source gas being $Si_\alpha O_{\alpha-1} R_{2\alpha-\beta+2}(OC_n H_{2n+1})_\beta$ wherein $\alpha$ is an integer of 1–3, $\beta$ is an integer of 1–3, n is an integer of 1–3, and R is $C_{1-6}$ hydrocarbon attached to Si;
   applying plasma energy to a space where the reaction gas is present above a substrate mounted on a heated substrate-supporting member;
   forming an etch-stop layer on the substrate from the reaction gas with plasma energy; and
   forming a laminated structure by forming at least one layer-to-be-etched on the substrate using a reaction gas composed of the same constituent gases as the reaction gas for the etch-stop layer but having a lower flow rate of the inert gas.

2. The method according to claim 1, wherein the laminated structure is a dual damascene structure.

3. The method according to claim 1 wherein the source gas is dimethyl-dimethoxy silane.

4. The method according to claim 1, wherein the step of forming the etch-stop layer and the step of forming the layer-to-be-etched are continuously conducted in the same chamber without breaking a vacuum.

5. The method according to claim 1, wherein in the step of forming the layer-to-be-etched, the inert gas flow rate is no more than 40% of the source gas flow rate.

6. The method according to claim 1, wherein the step of forming the etch-stop layer is conducted under conditions to adjust a dielectric constant of the etch-stop layer to 3.0 or lower.

7. The method according to claim 1, wherein the plasma energy is applied between a showerhead and a susceptor, which serve as upper and lower electrodes, respectively, wherein the substrate is mounted on the susceptor.

8. The method according to claim 1, wherein the source gas flow rate is in the range of 50 sccm to 200 sccm.

9. The method according to claim 1, further comprising etching the layer-to-be-etched except for the etch-stop layer to form a hole, and filling the hole with copper.

10. The method according to claim 1, wherein the plasma energy has a frequency of about 27 MHz.

11. The method according to claim 1, wherein the plasma energy has power of about 1000 W to about 3000 W.

12. The method according to claim 1, wherein the etch-stop layer and the layer-to-be-etched are formed under conditions where solely the inert gas flows are different.

13. A method of dielectric film integration, comprising the steps of:
    depositing a first dielectric layer on a substrate using a first reaction gas comprised of a source gas containing Si, C, O, and H wherein H is not attached to Si at a first source gas flow rate and an inert gas at a first inert gas flow rate, wherein the first inert gas flow rate is less than 40% of the first source gas flow rate, said first reaction gas being excited with plasma energy; and
    continuously depositing a second dielectric layer on top of the first dielectric layer using a second reaction gas composed of the same constituent gases as the first reaction gas at a second source gas flow rate and a at a second inert gas flow rate, wherein the second inert gas flow rate is 40% or higher of the second source gas flow rate, said second reaction gas being excited with plasma energy.

14. The method according to claim 13, wherein the source gas is an alkyl organic silicate.

15. The method according to claim 13, wherein the first and second dielectric layers are made of carbon-doped silicon oxide.

16. The method according to claim 13, wherein the first and second dielectric layers have a modulus of 12 GPa or lower and 13 GPa or higher, respectively.

17. The method according to claim 13, wherein the first and second dielectric layers have a hardness of 2.0 GPa or lower and 2.0 GPa or higher.

18. The method according to claim 13, wherein the first dielectric layer is an insulator, and the second dielectric layer is an etch stopper.

19. The method according to claim 13, wherein the step of forming the first dielectric layer and the step of forming the second dielectric layer are continuously conducted in the same chamber without breaking a vacuum.

20. The method according to claim 13, which is conducted in CVD chamber.

21. The method according to claim 13, wherein the step of forming the second dielectric layer is conducted under conditions to adjust a dielectric constant of said second dielectric layer to 3.0 or lower.

22. The method according to claim 13, wherein the first and second reaction gases are first excited with plasma energy in a remote plasma chamber disposed upstream of a reactor where the substrate is processed.

23. The method according to claim 13, wherein the first and second source gas flow rates are independently in the range of 50 sccm to 200 sccm.

24. The method according to claim 13, wherein the step of forming the first dielectric layer and the step of forming the second dielectric layer are continuously conducted in a single CVD reactor without unloading the substrate from the CVD reactor.

25. The method according to claim 13, wherein the plasma energy for each of the first and second dielectric layers has a frequency of about 27 MHz.

26. The method according to claim 13, wherein the plasma energy for each of the first and second dielectric layers has power of about 1000 W to about 3000 W.

27. The method according to claim 13, wherein the first dielectric layer and the second dielectric layer are formed under conditions where solely the inert gas flows are different.

28. The method according to claim 13, wherein the source gas is $Si_\alpha O_{\alpha-1} R_{2\alpha-\beta+2}(OC_n H_{2n+1})_\beta$ wherein $\alpha$ is an integer of 1–3, $\beta$ is an integer of 1–3, n is an integer of 1–3, and R is $C_{1-6}$ hydrocarbon attached to Si.

29. The method according to claim 13, wherein the source gas is dimethyl-dimethoxy silane.

30. A method of dielectric film integration, comprising the steps of:
    depositing a layer-to-be-etched on a substrate using a first reaction gas comprised of a source gas containing Si, C, O, and H at a source gas flow rate and an inert gas at an inert gas flow rate, wherein the inert gas flow rate is less than 40% of the source gas flow rate, said reaction gas being excited with plasma energy; and continuously depositing an etch-stop layer on top of the layer-to-be-etched layer while adjusting its hardness and modulus solely as a function of the inert gas flow rate.

31. The method according to claim 30, wherein the source gas is $Si_\alpha O_{\alpha-1} R_{2\alpha-\beta+2}(OC_n H_{2n+1})_\beta$ wherein $\alpha$ is an integer of 1–3, $\beta$ is an integer of 1–3, n is an integer of 1–3, and R is $C_{1-6}$ hydrocarbon attached to Si.

32. The method according to claim 30, wherein the plasma energy as a frequency of about 27 MHz.

33. The method according to claim 30, wherein the plasma energy has power of about 1000 W to about 3000 W.

34. A method of dielectric film integration, comprising the steps of:

depositing a layer-to-be-etched on a substrate using a reaction gas comprised of a source gas containing Si, C, O, and H at a source gas flow rate and an inert gas at an inert gas flow rate, said reaction gas being excited with plasma energy; and continuously depositing an etch-stop layer on top of the layer-to-be-etched layer while adjusting its hardness and modulus solely as a function of the inert gas flow rate which is 40% or higher of the source gas flow rate.

* * * * *